US009590332B2

(12) United States Patent
Peng

(10) Patent No.: US 9,590,332 B2
(45) Date of Patent: Mar. 7, 2017

(54) ELECTRICAL CONNECTOR

(71) Applicant: LOTES CO., LTD, Keelung (TW)

(72) Inventor: Jian Min Peng, Keelung (TW)

(73) Assignee: LOTES CO., LTD, Keelung (TW)

( * ) Notice: Subject to any disclaimer, the term of this patent is extended or adjusted under 35 U.S.C. 154(b) by 27 days.

(21) Appl. No.: 14/920,221

(22) Filed: Oct. 22, 2015

(65) Prior Publication Data

US 2016/0149322 A1    May 26, 2016

(51) Int. Cl.
    *H01R 12/00*     (2006.01)
    *H01R 12/70*     (2011.01)
    *H05K 7/10*     (2006.01)

(52) U.S. Cl.
    CPC ....... *H01R 12/7076* (2013.01); *H05K 7/1007* (2013.01); *H05K 7/1069* (2013.01)

(58) Field of Classification Search
    CPC .................................................. H01R 12/7076
    USPC ...................................................... 439/71, 526
    See application file for complete search history.

(56) References Cited

U.S. PATENT DOCUMENTS

| | | | | |
|---|---|---|---|---|
| 4,535,887 A * | 8/1985 | Egawa | ................. | H05K 7/1023 206/560 |
| 4,696,526 A * | 9/1987 | Newton | ............... | G01R 1/0475 174/535 |
| 4,725,922 A * | 2/1988 | Matsuoka | ............ | H05K 13/021 174/542 |
| 4,760,917 A * | 8/1988 | Vitek | ................... | H05K 7/1023 206/724 |
| 5,115,912 A * | 5/1992 | Murphy | ............... | H05K 7/1084 206/724 |
| 5,292,266 A * | 3/1994 | Matsuoka | ............ | H05K 7/1023 439/526 |
| 5,541,525 A * | 7/1996 | Wood | ...................... | H01L 22/20 257/E21.509 |
| 6,699,047 B1 * | 3/2004 | McHugh | ............ | H01R 13/6278 439/330 |
| 6,923,658 B2 * | 8/2005 | Cromwell | .............. | H05K 3/301 361/762 |
| 7,371,098 B2 * | 5/2008 | Wang | ................... | H05K 7/1053 439/330 |
| 7,384,273 B1 * | 6/2008 | Polnyi | ................ | H01R 12/7052 439/526 |

(Continued)

*Primary Examiner* — Neil Abrams
(74) *Attorney, Agent, or Firm* — Locke Lord LLP; Tim Tingkang Xia, Esq.

(57) ABSTRACT

An electrical connector for connecting a chip module, includes an insulating body, multiple conducting terminals received in the insulating body, and a fixing member having a base for fixing the chip module. The insulating body has an accommodating cavity that is rectangular and opened upward. A stop wall projects upward from each of four corners of the accommodating cavity. Each conducting terminal has a contact portion extending upward for electrically contacting a conductive connection surface of the chip module. The contact portions are located in the accommodating cavity and do not exceed the stop wall upward. The base is assembled above the insulating body. Four extending portions extend downward from the base and are assembled at an outer side of the stop walls. An inner side of each extending portion is provided with a guiding inclined surface cooperating with the outer side of the stop wall.

20 Claims, 7 Drawing Sheets

(56) References Cited

U.S. PATENT DOCUMENTS 9,022,791 B2 * 5/2015 Liao .................. H05K 7/1053
439/526
9,270,035 B2 * 2/2016 Yeh .................... H01R 4/48

* cited by examiner

ELECTRICAL CONNECTOR

CROSS-REFERENCE TO RELATED APPLICATION

This non-provisional application claims priority under 35 U.S.C. §119(a) on Patent Application No. 201420714611.8 filed in P.R. China on Nov. 25, 2014, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an electrical connector, and more particularly to an electrical connector electrically connected to a chip module.

BACKGROUND OF THE INVENTION

An electrical connector is designed in the industry, such as that described in Chinese Patent Application No. CN201310440991.0. This electrical connector includes an insulating body, conducting terminals, and a carrier. The insulating body has several side walls extending upward and an accommodating cavity formed by the side walls. Each of the conducting terminals has a contact portion extending into the accommodating cavity. The carrier can clamp a chip module and be assembled in the insulating body. The carrier includes a main body and a locking portion extending downward from the main body. The side wall of the insulating body is provided with an accommodating portion, and the accommodating portion is provided with an inclined surface provisionally supporting the locking portion and a slot disposed below the inclined surface and used for accommodating the locking portion. In this electrical connector, the carrier clamps the chip module and is assembled into the insulating body along a vertical direction. A problem of damaging the conducting terminals during assembly of a rotation manner can be resolved, but the locking portion of the carrier of the electrical connector cooperates with the side wall of the insulating body, and the inclined surface is disposed on the side wall of the insulating body, so that the structure of the insulating body needs to be changed. Moreover, when this structure is assembled, it is easy for alignment to be slightly inaccurate because of manually grasping the carrier, which makes the locking portion enter the accommodating cavity and collide with or hook the conducting terminals, and causing damage to the conducting terminals.

Therefore, a heretofore unaddressed need exists in the art to address the aforementioned deficiencies and inadequacies.

SUMMARY OF THE INVENTION

In one aspect, the present invention relates to an electrical connector that can effectively reduce a risk of damaging conducting terminals.

In one embodiment, an electrical connector is used for connecting to a chip module, where the chip module has a conductive connection surface. The electrical connector includes an insulating body, multiple conducting terminals, and a fixing member. The insulating body has an accommodating cavity that is rectangular and opened upward. A stop wall projects upward from each of four corners of the accommodating cavity. The multiple conducting terminals are received in the insulating body. Each conducting terminal has a contact portion extending upward and used for electrically contacting the conductive connection surface, and the contact portion is located in the accommodating cavity and does not exceed the stop wall upward. The fixing member includes a base for fixing the chip module. The base is assembled above the insulating body. Four extending portions extend downward from the base and are correspondingly assembled at an outer side of the stop wall, and an inner side of the extending portion is provided with a guiding inclined surface cooperating with the outer side of the stop wall.

In one embodiment, the fixing member is made of a material of plastic or metal. The base includes two opposite first side edges, and two opposite second side edges respectively connected to the two first side edges. The first side edges and the second side edges define an opening for a part of the chip module to pass through upward, and each of inner edges of the two first side edges or the two second side edges is provided with a clamping block protruding toward the center and cooperatively clamping the chip module. The extending portion extends downward from an outer edge of the first side edge and is located at an outer side of the chip module, and each extending portion is disposed at an end edge of the first side edge. A notch is formed between the extending portion and the second side edge, and the stop wall and a position at which the stop wall cooperates with the chip module are exposed from the notch. When the chip module is located at the fixing member, a bottom surface of the extending portion is not higher than the conductive connection surface of the chip module. A stopping block projecting downward from a bottom surface of the second side edge can be stopped at an outer side of the chip module. A grasping protruding block protrudes upward from a top surface of the first side edge, and the grasping protruding block is located at an outer side of the chip module.

In one embodiment, a flat plate portion extends from the extending portion to an outer side, and a bottom surface of the flat plate portion is flush with a bottom surface of the extending portion. Two flat plate portions located at a same first side edge are connected to each other by a bridging portion.

In another aspect, the present invention relates to an electrical connector used for connecting to a chip module, where the chip module has a conductive connection surface. The electrical connector includes an insulating body, multiple conducting terminals, and a fixing member. The insulating body includes two opposite first side walls extending along a length direction and two opposite second side walls extending along a width direction. A stop wall projects upward from at least one of the first side walls, and a top surface of the stop wall is the highest surface of the insulating body. The multiple conducting terminals are accommodated in the insulating body. Each conducting terminal has a contact portion extending upward and used for electrically contacting the conductive connection surface, and the contact portion does not exceed the stop wall upward. The fixing member includes a base centrally provided with an opening. An extending portion extends downward from a position of the base corresponding to the stop wall and is located at an outer side of the first side wall. An inner side of the extending portion is provided with a guiding inclined surface that can guide the extending portion to slide downward along a top edge at an outer side of the stop wall.

In one embodiment, the base includes two opposite first side edges, and two opposite second side edges respectively connected to the two first side edges. The first side edges and the second side edges define an opening for a part of the chip module to pass through upward, and each first side edge or second side edge is provided with a clamping block protruding toward the center and cooperatively clamping the chip module. Each of two end edges of each of the first side walls is provided with a stop wall, each of two end edges of each of the first side edges is provided with an extending portion, and the extending portion extends downward from an outer edge of the first side edge and is located at the outer side of the chip module. Two extending portions located at the first side edge are connected to each other by a connection portion, and the connection portion clamps the outer side of the chip module. A notch is formed between the extending portion and the second side edge, and the stop wall and a position at which the stop wall cooperates with the chip module are exposed from the notch. A flat plate portion extends from the extending portion to an outer side, and a bottom surface of the flat plate portion is flush with a bottom surface of the extending portion. An outer side of a second side wall is pivotally connected to a load plate that covers the insulating body in a rotatable manner, two flat plate portions located at a same first side edge are connected to each other by a bridging portion, and the bridging portion is provided with a reserved space for a side arm of the load plate to enter. A grasping protruding block protrudes upward from a top surface of the first side edge, the grasping protruding block extends along the length direction, and when the load plate covers the insulating body, the side arm of the load plate is located at an outer side of the grasping protruding block. The guiding inclined surface is disposed at a bottom edge at an inner side of the extending portion, and a bottom surface of the extending portion is lower than the conductive connection surface.

In a further aspect, the present invention relates to an electrical connector used for connecting to a chip module, where the chip module includes a substrate and a protruding portion projecting upward from the center of the substrate. The electrical connector includes an insulating body, a conducting terminal and a fixing member. The insulating body is provided with multiple side walls extending upward and an accommodating cavity formed by the side walls. The side wall is provided with a stop wall projecting upward. The conducting terminal is provided with a contact portion extending into the accommodating cavity. The fixing member is assembled with the insulating body along a vertical direction. The fixing member includes a base parallel to an upper surface of the stop wall, and the base clamps the periphery of the protruding portion and laminated at a top surface of the substrate. The base is assembled above the accommodating cavity, an extending portion extends downward from the base, the extending portion exceeds a bottom surface of the substrate downward, and the extending portion is correspondingly assembled at an outer side of the stop wall.

Compared with the related art, in certain embodiments of the present invention, an extending portion disposed on a fixing member cooperates with a stop wall that is on an insulating body and is located at the highest position. When alignment is slightly inaccurate when an operator manually grasps the fixing member to assemble a chip module downward, a bottom surface of the extending portion urges a top surface of the stop wall, and because the bottom surface of the extending portion is not higher than a conductive connection surface of the chip module, the chip module is entirely raised, so that the conductive connection surface is away from a contact portion of a conducting terminal, which may prevent the chip module from entering an accommodating cavity to damage the conducting terminal.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
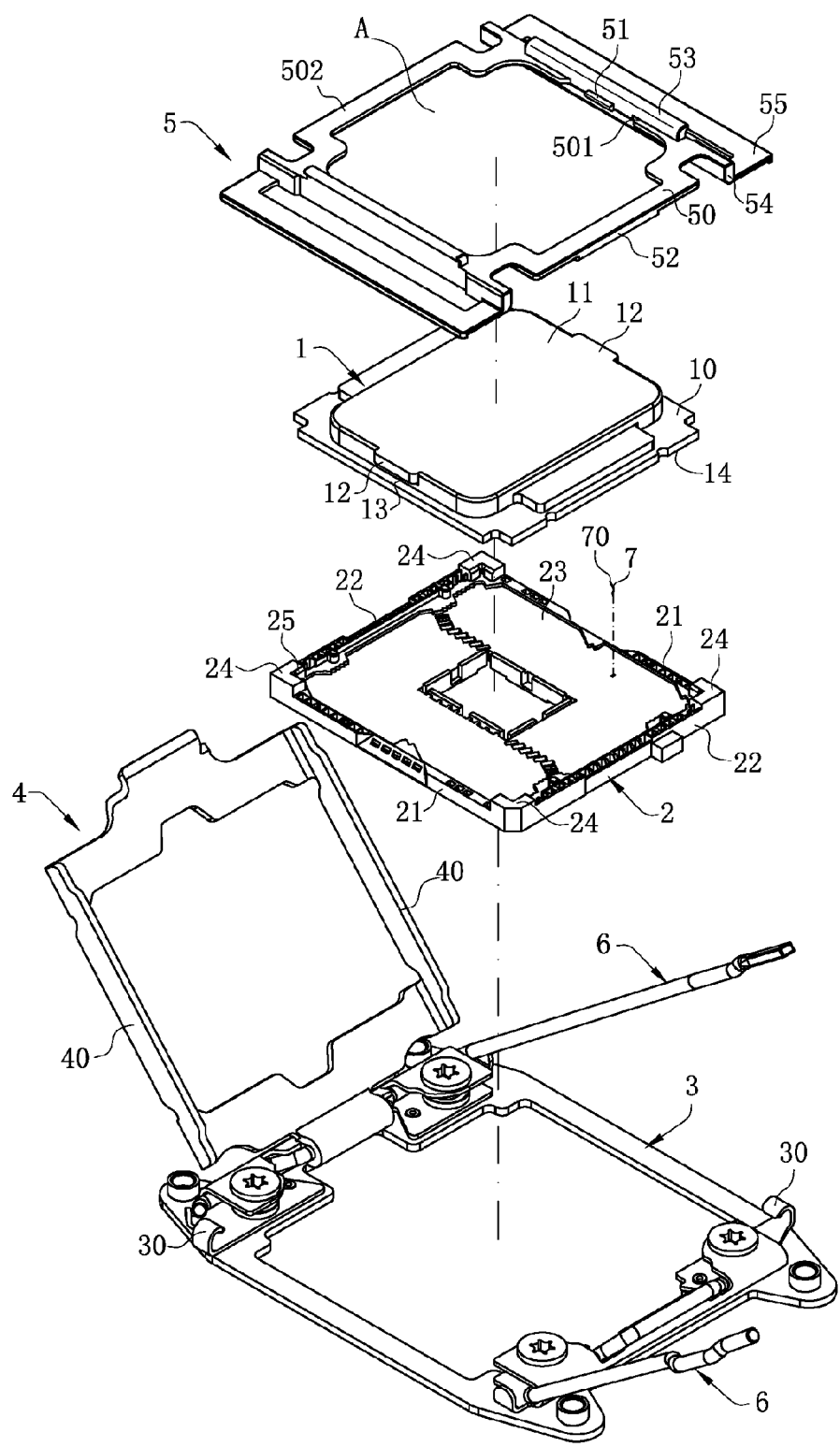
FIG. 1 is a schematic exploded view of an electrical connector according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-7. In accordance with the purposes of this invention, as embodied and broadly described herein, this invention, in one aspect, relates to an electrical connector.

As shown in FIG. 1, an electrical connector according to one embodiment of the present invention is used for electrically connecting a chip module 1 to a circuit board (not shown). The electrical connector mainly includes an insulating body 2, a socket 3 surrounding the insulating body 2, a load plate 4 pivotally connected to one end of the socket 3, and a fixing member 5 used for fixing the chip module 1. The chip module 1 includes a substrate 10 and a protruding portion 11 projecting upward from the center of the substrate 10. A part horizontally protrudes from each of two sides of the protruding portion 11 to form a holding portion 12 for an operator to hold. A slot 13 is formed between the holding portion 12 and the substrate 10. A bottom surface of the substrate 10 is provided with multiple contacting pads (not shown), thereby forming a conductive connection surface 14.

The socket 3 is made into a hollow frame shape by punching a metal plate material, and is fixedly disposed on the circuit board (not shown). Each of two ends of the socket 3 along a length direction is pivotally connected to a lever 6, and each of two corresponding levers 6 on the socket 3 is provided with a fixing buckling point 30 used for snap-fitting the lever 6.

Figure 3:
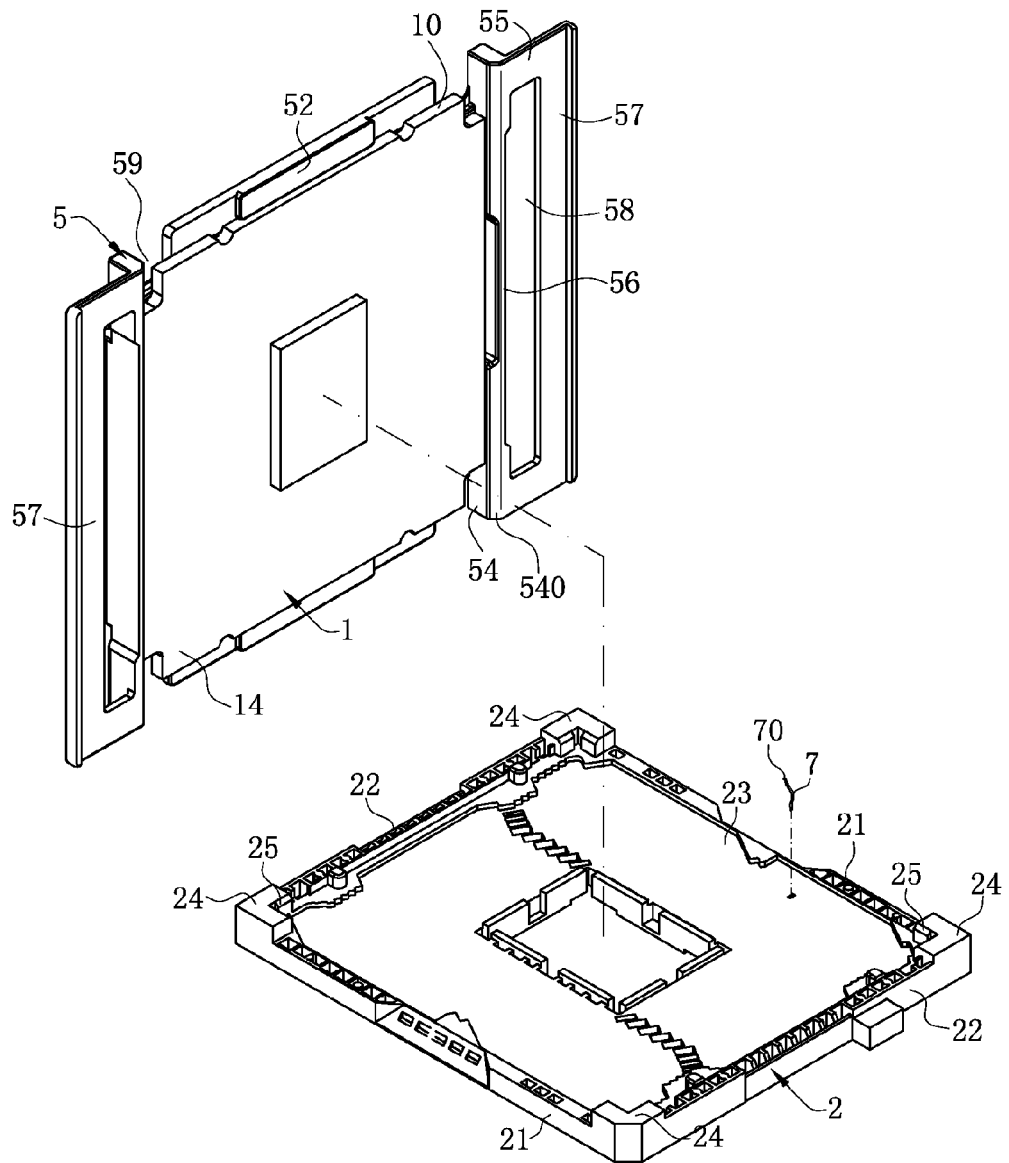
FIG. 3 is a schematic exploded view according to one embodiment of the present invention, wherein a chip module is fixed to a fixing member, but not assembled with an insulating body.

Referring to FIGS. 1 and 3, the insulating body 2 is injection-molded by a plastic material, disposed at the center of the socket 3, and surrounded by the socket 3. In one embodiment of the present invention, the insulating body 2 includes two opposite first side walls 21 extending along a length direction, and two opposite second side walls 22 extending along a width direction. The two first side walls 21 and the two second side walls 22 are respectively connected to form a rectangle, and the four side walls define an accommodating cavity 23 opened upward. A stop wall 24 projects upward from the first side wall 21, and the stop wall 24 is located at an end edge of the first side wall 21 (that is, a position at which the first side wall 21 is connected to the second side wall 22), extends from an upper part of the first side wall 21 to an upper part of the second side wall 22, and is entirely in a shape of L. In one embodiment, a stop wall 24 in the shape of L is formed at each of four corners of the accommodating cavity 23, and a top surface of the stop wall 24 is the highest surface of the entire insulating body 2. An inner side of each of the stop walls 24 is further provided with a guiding portion 25 guiding the chip module 1 to enter the accommodating cavity 23.

Multiple conducting terminals 7 are received in the insulating body 2. Each conducting terminal 7 has a contact portion 70 extending upward, and the contact portion 70 is located in the accommodating cavity 23 and does not exceed the stop wall 24 upward.

Figure 2:
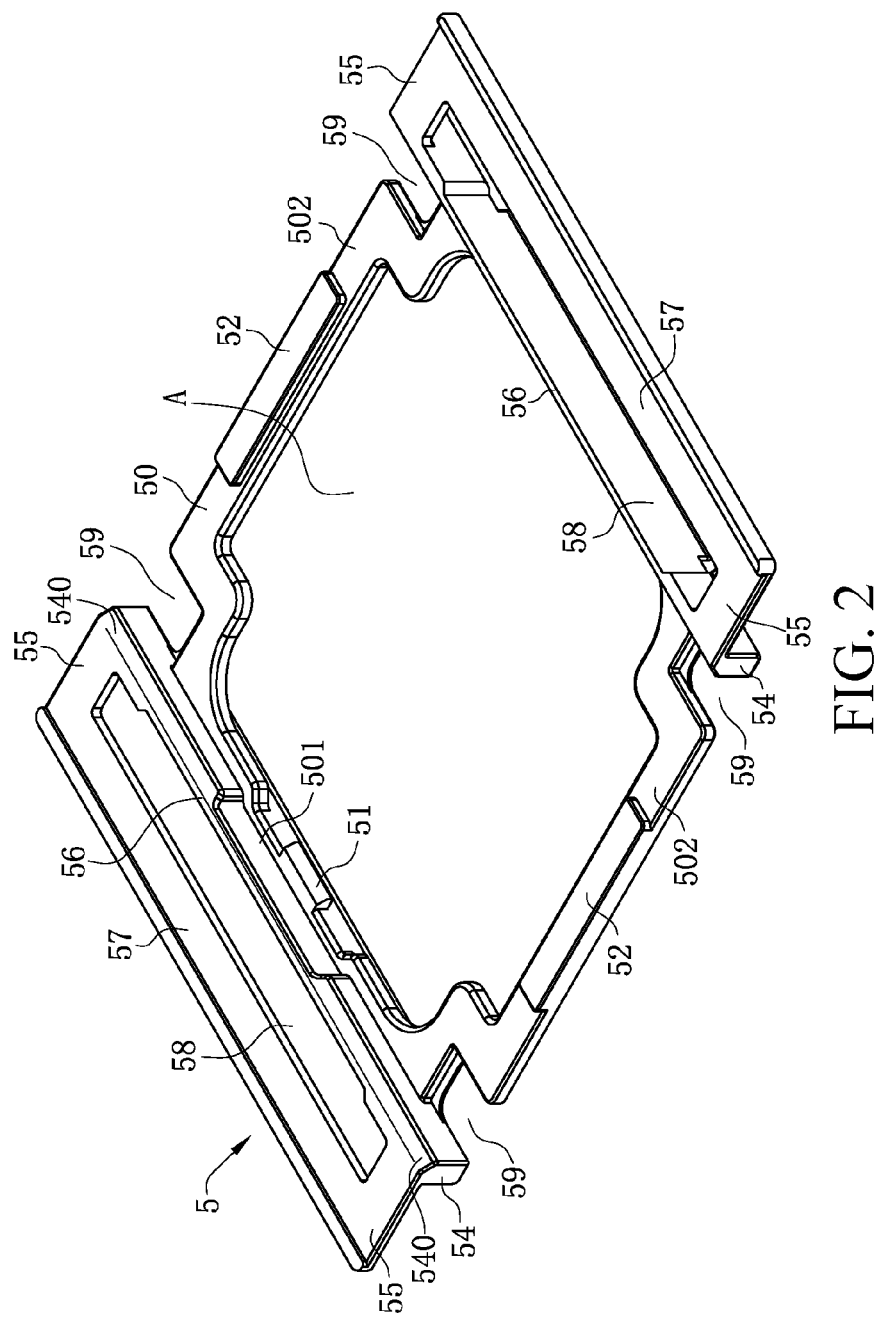
FIG. 2 is a schematic diagram of a bottom surface of a fixing member according to one embodiment of the present invention.
Figure 4:
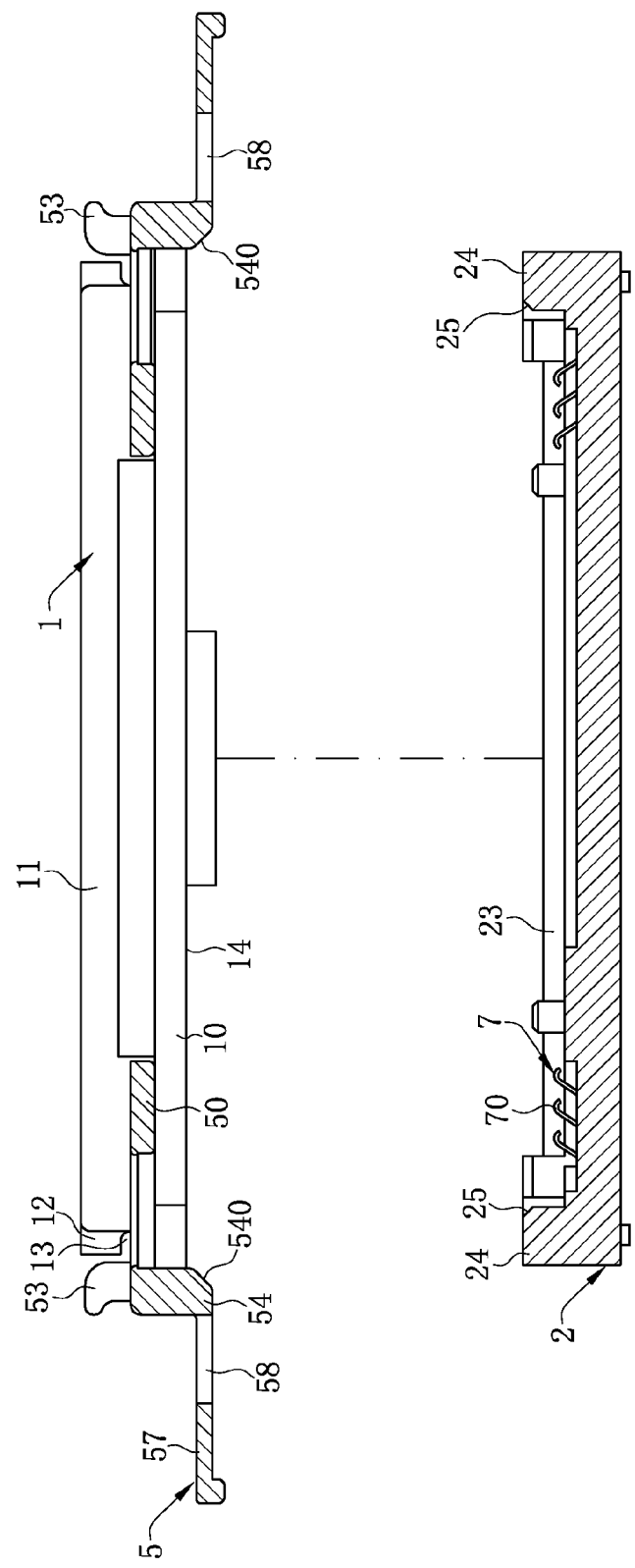
FIG. 4 is a schematic sectional view according to one embodiment of the present invention, where a chip module is fixed to a fixing member, but not assembled with an insulating body.

As shown in FIGS. 2-4, the fixing member 5 is made of plastic, and has flexibility. In other embodiments, the fixing member 5 may also be made into a plate shape by punching a metal material. The fixing member 5 includes a base 50 in a frame shape. The base 50 includes two opposite first side edges 501, and two opposite second side edges 502 respectively connected to the two first side edges 501. The first side edges 501 and the second side edges 502 define a through-hole A for the protruding portion 11 of the chip module 1 to pass through upward. A clamping block 51 that can be cooperatively clamped in the slot 13 at the outer side of the protruding portion 11 protrudes from each of inner edges of the two first side edges 501 toward the center. In other embodiments, the clamping block 51 may also be disposed at each of inner edges of the two second side edges 502. The entire base 50 clamps the periphery of the protruding portion 11 and is laminated at the top surface of the substrate 10. A stopping block 52 projecting downward from a bottom surface of the second side edge 502 can be stopped at an outer side of the substrate 10.

A grasping protruding block 53 located at the outer side of the chip module 1 protrudes upward from a top surface of each first side edge 501, and the grasping protruding block 53 extends along the length direction, and has a length far greater than that of the holding portion 12, to help an operator grasp the fixing member 5 with a hand.

Referring to FIGS. 2 and 5-7, an extending portion 54 extends downward from each of two end edges of each first side edge 501 close to the outer edge, and a bottom edge at an inner side of the extending portion 54 is provided with a guiding inclined surface 540. The extending portion 54 is located at the periphery of the chip module 1, and a bottom surface of the extending portion 54 is lower than the conductive connection surface 14 of the chip module 1. A flat plate portion 55 extends horizontally from a bottom end of the extending portion 54 to an outer side, and a bottom surface of the flat plate portion 55 is flush with a bottom surface of the extending portion 54. The length between two extending portions 54 on a same first side edge 501 (along the length direction) is roughly equal to the length of the first side wall 21, and the width between two extending portions 54 on different first side edges 501 (along the width direction) is slightly greater than the width of the second side wall 22, so that the extending portions 54 can be correspondingly assembled at the outer side of the stop wall 24.

As shown in FIGS. 2 and 4, in this embodiment, for convenience of molding and enhancing the strength of the extending portion 54, two extending portions 54 located at a same first side edge 501 extend along the length direction, and the two extending portions 54 are connected into an entirety by a connection portion 56. The connection portion 56 clamps the outer side of the chip module 1, and a bottom surface of the connection portion 56 is flush with a bottom surface of the extending portion 54. Likewise, two flat plate portions 55 located at a same first side edge 501 are also connected into an entirety by a bridging portion 57 in a plate shape. A side of each of the flat plate portions 55 close to the chip module 1 is further provided with a reserved space 58, and the length of the reserved space 58 along the length direction is less than that of the first side wall 21, which is just provided for the load plate 4 to enter during covering.

Figure 5:
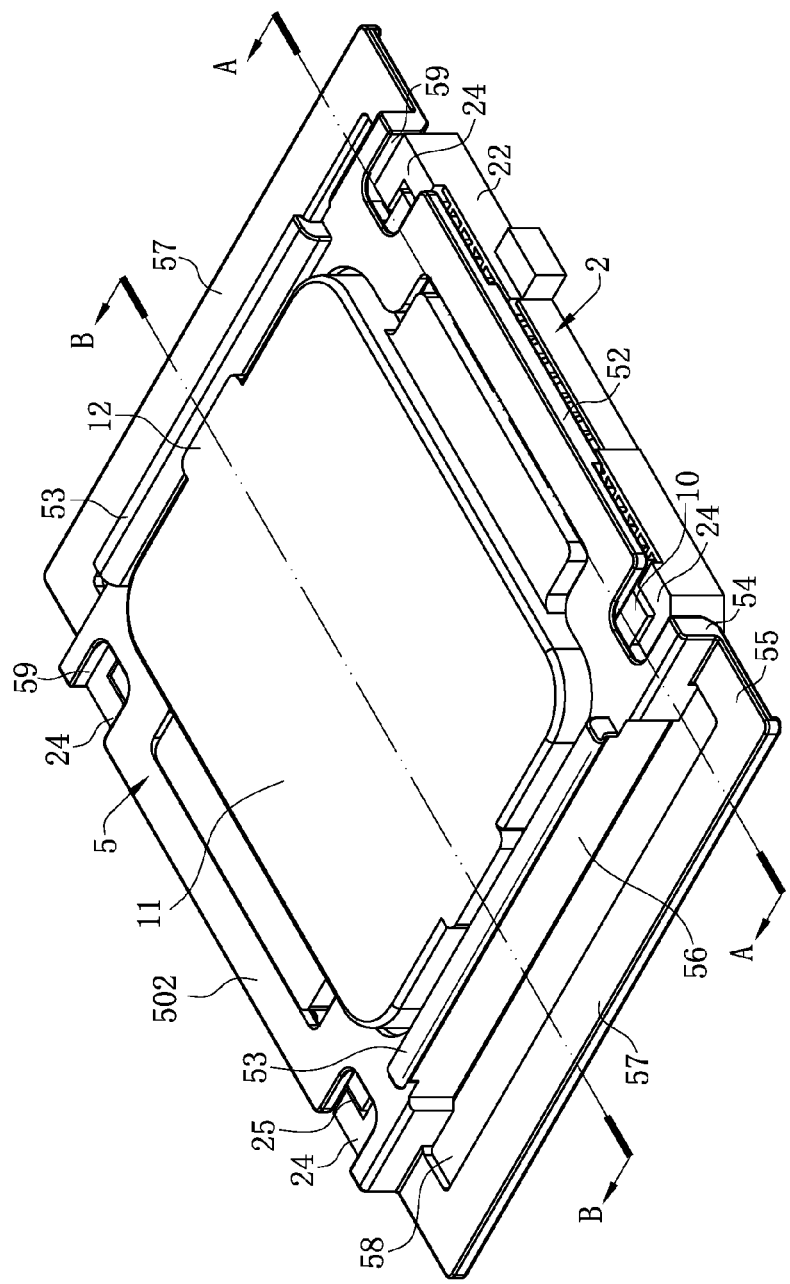
FIG. 5 is a schematic three-dimensional diagram according to one embodiment of the present invention, where a fixing member and a chip module are assembled with an insulating body.
Figure 6:
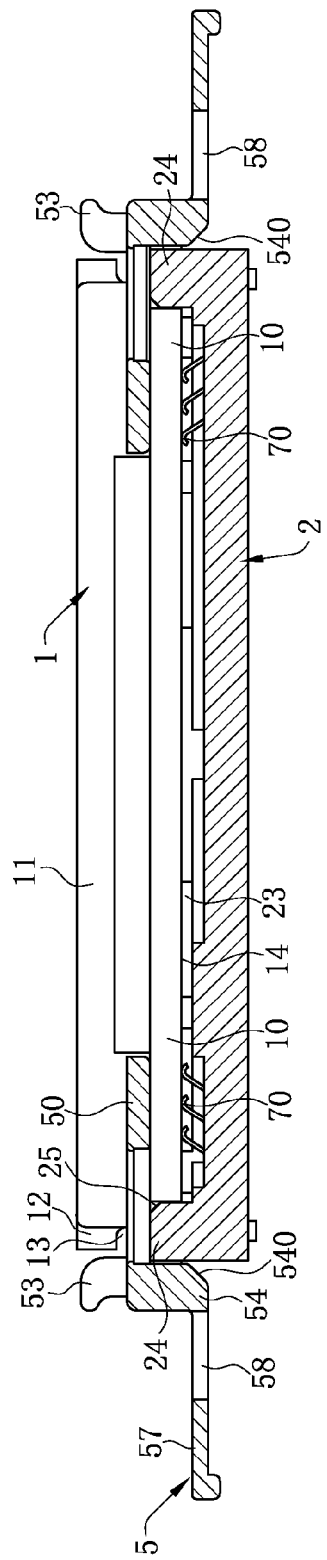
FIG. 6 is a schematic sectional view along a line A-A in FIG. 5.
Figure 7:
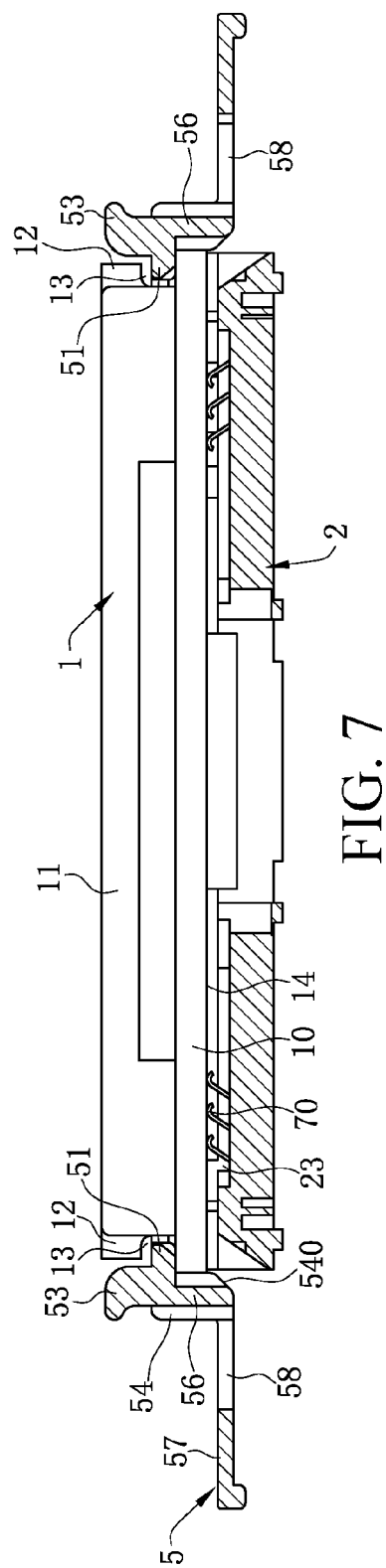
FIG. 7 is a sectional view along a line B-B in FIG. 6.

As shown in FIGS. 4 and 5, for convenience of observing whether the chip module 1 correctly enters the accommodating cavity 23 along the guiding portion 25 on the stop wall 24, a position on the second side edge 502 close to each extending portion 54 is further provided with a notch 59, and both the stop wall 24 and a position at which the stop wall 24 cooperates with the chip module 1, that is, the guiding portion 25, are exposed from the notch 59.

As shown in FIG. 1, the load plate 4 is pivotally connected to an outer side of the second side edge 502, and the load plate 4 has two side arms 40 along the length direction, and the length of the side arm 40 is roughly equal to the length of the reserved space 58.

The assembly according to certain embodiments of the present invention is very simple, it is only needed that the clamping block 51 at the inner edge of the first side edge 501 is aligned with the slot 13 on the chip module 1, so that the clamping block 51 enters and is locked in the slot 13, the stopping block 52 on the bottom of the second side edge 502 is stopped at an outer side of the substrate 10, the connection portion 56 between two extending portions 54 clamps the outer side of the substrate 10, and therefore the chip module 1 can be fixed onto the fixing member 5. In this case, each of four corners of the chip module 1 is correspondingly exposed from the notch 59 on the second side edge 502, and residual parts on the first side edge 501 and the second side edge 502 are laminated at the top surface of the substrate 10.

Then, the operator can use a hand to grasp the grasping protruding block 53 on the fixing member 5. The fixing member 5 and the chip module 1 are entirely placed horizontally. Then each extending portion 54 is respectively aligned with an outer side of each stop wall 24, the four corners of the chip module 1 are aligned with the guiding portions 25 at the inner sides of the stop wall 24, and are assembled to the insulating body 2 vertically downward. The guiding inclined surface 540 at the bottom edge of the extending portion 54 cooperates with the outer side of the stop wall 24 to guide the extending portion 54 to move vertically downward along the outer side of the stop wall 24, the four corners of the chip module 1 are guided by the guiding portions 25 on the stop wall 24, until the chip module 1 enters the accommodating cavity 23, and the conductive connection surface 14 contacts the contact portion 70 of the conducting terminal 7. In this case, the base 50 of the fixing member 5 is located above the accommodating cavity 23, and the extending portion 54 is correspondingly located at an outer side of the stop wall 24.

Then, the load plate 4 covers the chip module 1 in a rotatable manner, each side arm 40 of the load plate 4 correspondingly enters the reserved space 58 of the flat plate portion 55, and the side arm 40 is correspondingly located at an outer side of the grasping protruding block 53. Finally, each lever 6 is correspondingly rotated to press the load plate 4.

In certain embodiments of the present invention, the stop wall 24 on the insulating body 2 of the existing model at the highest position is used. The extending portion 54 disposed on the fixing member 5 cooperates with the stop wall 24. When alignment is slightly inaccurate when the operator manually grasps the fixing member 5 to assemble the chip module 1 downward, a bottom surface of the extending portion 54 urges a top surface of the stop wall 24, and therefore the chip module 1 is entirely raised, so that the conductive connection surface 14 is away from the contact portion 70 of the conducting terminal 7, which may prevent the chip module 1 from entering the accommodating cavity 23 to damage the conducting terminal 7. In this case, as long as the operator presses the fixing member 5 downward by slightly applying a force, the fixing member 5 is offset to a correct position under sliding guidance of the guiding inclined surface 540, thereby guiding the chip module 1 to correctly enter the accommodating cavity 23.

Additionally, the flat plate portion 55 horizontally extending at the outer side of the extending portion 54 allows the operator to have a relatively large deviation in an alignment process. For example, when the operator manually grasps the fixing member 5 to deviate in a relatively large range along the width direction, the extending portion 54 below one of the first side edges 501 may be already away from the outer side of the stop wall 24 above the insulating body 2, and the extending portion 54 below an opposite first side edge 501 may be located above the accommodating cavity 23. In this case, the flat plate portion 55 of the opposite first side edge 501 urges a top surface of the stop wall 24, and therefore the chip module 1 is entirely raised, which likewise can play a role of protecting the conducting terminal 7. The flat plate portion 55 may further stop the hand of the operator from entering the accommodating cavity 23 to touch the conducting terminal 7.

In certain embodiments of the present invention, the existing insulating body 2 relatively frequently used (stop walls 24 are disposed at four corners) may be used, and the structure of the insulating body 2 does not need to be changed. Alternatively, the structure of the insulating body 2 may also be slightly modified. In other embodiments, there may be one stop wall 24, the stop wall 24 can be disposed at any one corner of the accommodating cavity 23, or there may be two stop walls 24 separately disposed at a same side of the accommodating cavity 23 or disposed along a diagonal line, or there may be three stop walls 24, and a quantity of and positions of extending portions 54 correspond to those of the stop walls 24. The present invention is not limited thereto.

Compared with the related art, certain embodiments of the present invention have the following beneficial advantages.

1. An extending portion 54 disposed on a fixing member 5 cooperates with a stop wall 24 that is on an insulating body 2 and is located at the highest position. Therefore when alignment is slightly inaccurate when an operator manually grasps the fixing member 5 to assemble a chip module 1 downward, a bottom surface of the extending portion 54 urges a top surface of the stop wall 24, and because the bottom surface of the extending portion 54 is not higher than a conductive connection surface 14 of the chip module 1, the chip module 1 is entirely raised, so that the conductive connection surface 14 is away from a contact portions 70 of a conducting terminals 7, which may prevent the chip module 1 from entering an accommodating cavity 23 to damage the conducting terminals 7.

2. The fixing member 5 is assembled to the insulating body 2 along a vertical direction, and therefore the chip module 1 fixed on the fixing member 5 also contacts the conducting terminals 7 in the accommodating cavity 23 horizontally downward, which may reduce a risk of pressing and damaging the conducting terminals 7 caused by non-uniform forces applied to contact portions 70.

3. The extending portion 54 is assembled at an outer side of the stop wall 24, and therefore it is not easy for the extending portion 54 to enter the accommodating cavity 23 to touch the conducting terminals 7.

4. A flat plate portion 55 further extending laterally at the bottom end the extending portion 54 allows the operator to have a relatively large deviation in an alignment process, the flat plate portion 55 urges a top surface of the stop wall 24, and the chip module 1 is entirely raised, which likewise can play a role of protecting the conducting terminals 7. The flat plate portion 55 may further stop the hand of the operator from entering the accommodating cavity 23 to touch the conducting terminals 7.

5. Two extending portions 54 are connected into an entirety by a connection portion 56, the strength of the extending portions 54 are enhanced, and because the connection portion 56 clamps an outer side of the chip module 1, it can be further ensured that the chip module 1 is stably fixed on the fixing member 5.

6. A bottom surface of the flat plate portion 55 is flush with a bottom surface of the extending portion 54, and therefore when deviation occurs in assembly and alignment, the flat plate portion 55 urges the top surface of the stop wall 24, and it can ensure that the extending portion 54 enters the accommodating cavity 23 uneasily, which plays a role of protecting the conducting terminals 7.

7. Because two flat plate portions of 55 at a same side are connected into an entirety by a bridging portion 57, the strength of the flat plate portions 55 are enhanced, which prevents the flat plate portions 55 from being unwrapped or deformed because of a supporting force of the stop wall 24, thereby ensuring that the flat plate portions 55 can play a role of protecting the conducting terminals 7.

8. A clamping block 51 that is on the fixing member 5 and is located at an inner edge of a first side edge 501 and a stopping block 52 that is on the fixing member 5 and is located on the bottom of the second side edge 502 play roles of clamping and stopping the chip module 1 from different directions, so that the chip module 1 can be firmly fixed on the fixing member 5.

9. A grasping protruding block 53 is disposed on the first side edge 501, and has a length far greater than the length of the holding portion 12, and therefore it is convenient for the operator to grasp the fixing member 5 with a hand, and the fixing member 5 and the chip module 1 are entirely assembled to the insulating body 2.

10. A notch 59 is disposed at a position on the second side edge 502 close to each extending portion 54, and both the stop wall 24 and a position at which the stop wall 24 cooperates with the chip module 1, that is, the guiding portion 25, are exposed from the notch 59, and therefore it is convenient for the operator to observe, in an assembly process, whether the chip module 1 correctly enters the accommodating cavity 23 along the guiding portion 25 on the stop wall 24, thereby further preventing the conducting terminals 7 from being damaged.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for connecting to a chip module having a conductive connection surface, the electrical connector comprising:
    an insulating body having an accommodating cavity that is rectangular and opened upward, wherein a stop wall projects upward from each of four corners of the accommodating cavity;
    a plurality of conducting terminals received in the insulating body, wherein each conducting terminal has a contact portion extending upward and used for electrically contacting the conductive connection surface, and the contact portion is located in the accommodating cavity and does not exceed the stop walls upward; and
    a fixing member having a base for fixing the chip module, wherein the base is assembled above the insulating body, four extending portions extend downward from the base and are correspondingly assembled at an outer side of the stop walls, and an inner side of each of the extending portions is provided with a guiding inclined surface cooperating with the outer side of corresponding one of the stop walls.

2. The electrical connector of claim 1, wherein the base comprises two opposite first side edges, and two opposite second side edges respectively connected to the two first side edges, the first side edges and the second side edges define an opening for a part of the chip module to pass through upward, and each of inner edges of the two first side edges or the two second side edges is provided with a clamping block protruding toward the center and cooperatively clamping the chip module.

3. The electrical connector of claim 2, wherein the extending portion extends downward from an outer edge of the first side edge and is located at an outer side of the chip module, and each extending portion is disposed at an end edge of the first side edge.

4. The electrical connector of claim 3, wherein a notch is formed between the extending portion and the second side edge, and the stop wall and a position at which the stop wall cooperates with the chip module are exposed from the notch.

5. The electrical connector of claim 3, wherein when the chip module is located at the fixing member, a bottom surface of the extending portion is not higher than the conductive connection surface of the chip module.

6. The electrical connector of claim 2, wherein a stopping block projecting downward from a bottom surface of the second side edge, and is configured to be stopped at an outer side of the chip module.

7. The electrical connector of claim 2, wherein a grasping protruding block protrudes upward from a top surface of the first side edge, and the grasping protruding block is located at an outer side of the chip module.

8. The electrical connector of claim 1, wherein a flat plate portion extends from the extending portion to an outer side, and a bottom surface of the flat plate portion is flush with a bottom surface of the extending portion.

9. The electrical connector of claim 8, wherein two flat plate portions located at a same first side edge are connected to each other by a bridging portion.

10. The electrical connector of claim 1, wherein the fixing member is made of a material of plastic or metal.

11. An electrical connector for connecting to a chip module having a conductive connection surface, the electrical connector comprising:
    an insulating body having two opposite first side walls extending along a length direction and two opposite second side walls extending along a width direction, wherein a stop wall projects upward from at least one of the first side walls, and a top surface of the stop wall is the highest surface of the insulating body;
    a plurality of conducting terminals received in the insulating body, wherein each conducting terminal has a contact portion extending upward and used for electrically contacting the conductive connection surface, and the contact portion does not exceed the stop wall upward; and
    a fixing member having a base centrally provided with an opening, wherein an extending portion extends downward from a position of the base corresponding to the stop wall and is located at an outer side of the first side wall, and an inner side of the extending portion is provided with a guiding inclined surface that can guide the extending portion to slide downward along a top edge at an outer side of the stop wall.

12. The electrical connector of claim 11, wherein the base comprises two opposite first side edges, and two opposite second side edges respectively connected to the two first side edges, the first side edges and the second side edges define an opening for a part of the chip module to pass through upward, and each first side edge or second side edge is provided with a clamping block protruding toward the center and cooperatively clamping the chip module.

13. The electrical connector of claim 12, wherein each of two end edges of each of the first side walls is provided with a stop wall, each of two end edges of each of the first side edges is provided with an extending portion, and the extending portion extends downward from an outer edge of the first side edge and is located at the outer side of the chip module.

14. The electrical connector of claim 13, wherein two extending portions located at the first side edge are connected to each other by a connection portion, and the connection portion clamps the outer side of the chip module.

15. The electrical connector of claim 12, wherein a notch is formed between the extending portion and the second side edge, and the stop wall and a position at which the stop wall cooperates with the chip module are exposed from the notch.

16. The electrical connector of claim 12, wherein a flat plate portion extends from the extending portion to an outer side, and a bottom surface of the flat plate portion is flush with a bottom surface of the extending portion.

17. The electrical connector of claim 16, wherein an outer side of a second side wall is pivotally connected to a load plate that covers the insulating body in a rotatable manner, two flat plate portions located at a same first side edge are connected to each other by a bridging portion, and the bridging portion is provided with a reserved space for a side arm of the load plate to enter.

18. The electrical connector of claim 17, wherein a grasping protruding block protrudes upward from a top surface of the first side edge, the grasping protruding block extends along the length direction, and when the load plate covers the insulating body, the side arm of the load plate is located at an outer side of the grasping protruding block.

19. The electrical connector of claim 11, wherein the guiding inclined surface is disposed at a bottom edge at an inner side of the extending portion, and a bottom surface of the extending portion is lower than the conductive connection surface.

20. An electrical connector for connecting to a chip module, wherein
    the chip module comprises a substrate and a protruding portion projecting upward from the center of the substrate;
    the electrical connector comprises an insulating body, a conducting terminal and a fixing member;
    the insulating body is provided with multiple side walls extending upward and an accommodating cavity formed by the side walls, the side wall is provided with a stop wall projecting upward, the conducting terminal is provided with a contact portion extending into the accommodating cavity, the fixing member is assembled with the insulating body along a vertical direction, the fixing member comprises a base parallel to an upper surface of the stop wall, and the base clamps the periphery of the protruding portion and is laminated at a top surface of the substrate; and
    the base is assembled above the accommodating cavity, an extending portion extends downward from the base, the extending portion exceeds a bottom surface of the substrate downward, and the extending portion is correspondingly assembled at an outer side of the stop wall.

* * * * *